(12) United States Patent
Ishihara

(10) Patent No.: US 9,467,157 B2
(45) Date of Patent: Oct. 11, 2016

(54) ATOMIC CELL, ATOMIC CELL MANUFACTURING METHOD, QUANTUM INTERFERENCE DEVICE, ATOMIC OSCILLATOR, ELECTRONIC DEVICE, AND MOVING OBJECT

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/847,323

(22) Filed: Sep. 8, 2015

(65) Prior Publication Data

US 2016/0072439 A1   Mar. 10, 2016

(30) Foreign Application Priority Data

Sep. 8, 2014   (JP) .................................. 2014-182009

(51) Int. Cl.
*H03B 17/00* (2006.01)
*H03L 7/26* (2006.01)
*H03L 1/04* (2006.01)

(52) U.S. Cl.
CPC .. *H03L 7/26* (2013.01); *H03L 1/04* (2013.01)

(58) Field of Classification Search
CPC ..................................................... H03B 17/00
USPC ....................................................... 331/94.1
See application file for complete search history.

(56) References Cited

U.S. PATENT DOCUMENTS

| 5,256,995 A | 10/1993 | Scholes |
| 8,299,860 B2 | 10/2012 | Youngner et al. |
| 8,941,442 B2 | 1/2015 | Youngner et al. |
| 2010/0189605 A1* | 7/2010 | Schmid ................ B01L 3/508 422/552 |
| 2013/0027142 A1* | 1/2013 | Chindo .................... H03L 1/02 331/94.1 |

FOREIGN PATENT DOCUMENTS

| JP | H06-204586 A | 7/1994 |
| JP | 2009-212416 A | 9/2009 |
| JP | 2009-283526 A | 12/2009 |
| JP | 2010-205875 A | 9/2010 |
| JP | 2013-125907 A | 6/2013 |
| JP | 2014-088308 A | 5/2014 |

* cited by examiner

*Primary Examiner* — Joseph Chang
(74) *Attorney, Agent, or Firm* — Harness, Dickey & Pierce, P.L.C.

(57) ABSTRACT

An atomic cell includes: metallic atoms; a body portion having a through hole; window portions that are bonded to the body portion and form an inner space where the metallic atoms are sealed together with the body portion; a communication hole that communicates with the inner space and forms a groove and a hole; and a sealing portion that is disposed at a position that overlaps a bonding portion of the body portion and one window portion in a plan view seen in a direction where the body portion and the window portions are overlapped and blocks the communication hole by fusion.

22 Claims, 9 Drawing Sheets

ATOMIC CELL, ATOMIC CELL MANUFACTURING METHOD, QUANTUM INTERFERENCE DEVICE, ATOMIC OSCILLATOR, ELECTRONIC DEVICE, AND MOVING OBJECT

CROSS REFERENCE

This application claims benefit of Japanese Application JP 2014-182009, filed on Sep. 8, 2014. The disclosure of the prior application is hereby incorporated by reference herein in its entirety.

BACKGROUND

1. Technical Field

The present invention relates to an atomic cell, an atomic cell manufacturing method, a quantum interference device, an atomic oscillator, an electronic device, and a moving object.

2. Related Art

As an oscillator having a highly accurate oscillation characteristic over a long term, an atomic oscillator that oscillates based on energy transfer of atoms of an alkaline metal such as rubidium or cesium is known.

Generally, an operation principle of the atomic oscillator is divided into a method using a double resonance phenomenon using light and microwaves, and a method using coherent population trapping (CPT) using two types of lights having different wavelengths. Any type of atomic oscillator includes an atomic cell (gas cell) in which an alkaline metal is sealed (for example, see JP-A-2009-212416).

As such an atomic cell, an atomic cell having a structure in which plural substrates are stacked, which is designed for miniaturization according to a recent demand for miniaturization of an atomic oscillator, is known as disclosed in JP-A-2009-212416. In JP-A-2009-212416, a first transparent substrate including a gas introduction portion, a second transparent substrate including a through hole, and a third transparent substrate are sequentially stacked and bonded, openings on opposite ends of the through hole in the second substrate are blocked by the first transparent substrate and the third transparent substrate to form a space, alkaline metal vapor is introduced into the space through the gas introduction portion, and then, the gas introduction portion is blocked by fusion to seal the space. Then, a stacked body formed by the first to third transparent substrates is individualized by dicing to thereby obtain an atomic cell.

In the atomic cell according to JP-A-2009-212416, since the gas introduction portion overlaps a region to be irradiated with light in the atomic cell when seen in a stacking direction of the stacked body, when light is applied from the stacking direction of the stacked body, passage of the light is interrupted by the gas introduction portion. Thus, in the atomic cell according to JP-A-2009-212416, light passes in a direction parallel to a surface of the substrate.

However, in the atomic cell according to JP-A-2009-212416, since light passes through a cut section having fine unevenness formed by dicing of the second transparent substrate, the light is scattered on the cut section, and as a result, the intensity of the light after passage is reduced.

SUMMARY

An advantage of some aspects of the invention is to provide an atomic cell having a sealing portion formed by fusion, an atomic cell manufacturing method, a quantum interference device, and an atom oscillator which are capable of suppressing the intensity of light after passage without being reduced, and an electronic device and a moving object with excellent reliability, including such a quantum interference device.

The invention can be implemented as the following forms or application examples.

Application Example 1

This application Example is directed to an atomic cell including metallic atoms, a first substrate having a concave portion which is opened on one surface side thereof, a second substrate that is bonded to the one surface side of the first substrate, and forms an inner space where the metallic atoms are sealed, together with the first substrate, a communication hole that communicates with the inner space, and a sealing portion that is disposed at a position that overlaps a bonding portion of the first substrate and the second substrate in a plan view seen in a direction where the first substrate and the second substrate are overlapped to block the communication hole by fusion.

According to the atomic cell with this configuration, since the sealing portion overlaps the bonding portion in a plan view, it is possible to prevent or suppress the sealing portion from being overlapped with the position of the inner space in a plan view. Thus, when light is applied in a direction where the first substrate and the second substrate are overlapped, it is possible to prevent or reduce interruption of light passage in the sealing portion. Further, when the light is applied in this way, since the light passes through smooth plate surfaces of the first substrate and the second substrate, light scattering is reduced, and accordingly, it is possible to suppress the intensity of the light from being reduced.

Application Example 2

In the atomic cell according to the application positioned to be closer to the first substrate than a surface of the second substrate on a side opposite to the first substrate.

With this configuration, it is possible to achieve miniaturization of the atomic cell, to thereby enhance the degree of freedom for installation of the atomic cell.

Application Example 3

This application example is directed to an atomic cell manufacturing method including: preparing a stacked structure that includes a first substrate having a concave portion which is opened on one surface side thereof, a second substrate that is bonded to the one surface side of the first substrate and forms an inner space together with the first substrate, and a communication hole that has an opening portion which is disposed at a position that overlaps a bonding portion of the first substrate and the second substrate in a plan view seen in a direction where the first substrate and the second substrate are overlapped and is opened outside and through which the inner space communicates with an external space, and sealing the inner space by blocking the opening portion of the communication hole by fusion in a state where metallic atoms are introduced in the inner space.

According to the atomic cell manufacturing method with this configuration, in the obtained atomic cell, since the sealing portion overlaps the bonding portion in a plan view, it is possible to prevent or suppress the sealing portion from being overlapped with the position of the inner space in a plan view. Thus, when light is applied in a direction where the first substrate and the second substrate are overlapped in the obtained atomic cell, it is possible to prevent or reduce interruption of light passage in the sealing portion. Further, when the light is applied in this way, since the light passes through smooth plate surfaces of the first substrate and the second substrate, light scattering is reduced, and accordingly, it is possible to suppress the intensity of the light after passage from being reduced.

Application Example 4

In the atomic cell manufacturing method according to the application example, it is preferable that, in the preparing of the stacked structure, the first substrate includes a third substrate having a through hole that is penetratingly formed in a thickness direction, and a fourth substrate that is bonded to one surface of the third substrate and forms the concave portion together with the third substrate.

With this configuration, as one of the second substrate and the fourth substrate is used as a light incident side window portion and the other one thereof is used as a light output side window portion, it is possible to effectively reduce light scattering in the respective window portions due to smoothness of the surfaces of the second substrate and the fourth substrates.

Application Example 5

In the atomic cell manufacturing method according to the application example, it is preferable that, in the preparing of the stacked structure, the second substrate and the fourth substrate include glass, respectively, and the third substrate includes silicon.

With this configuration, it is possible to simply air-tightly bond each of the second substrate and the fourth substrate with the third substrate by anodic bonding.

Application Example 6

In the atomic cell manufacturing method according to the application example, it is preferable that, in the preparing of the stacked structure, the opening portion of the communication hole is provided in the second substrate.

With this configuration, it is possible to simply form the opening portion of the communication hole in the second substrate with high accuracy by an etching process, for example.

Application Example 7

In the atomic cell manufacturing method according to the application example, it is preferable that in the preparation of the stacked structure, the stacked structure has a protruding cylindrical portion that surrounds the opening portion of the communication hole.

With this configuration, it is possible to easily block the opening portion of the communication hole by fusing.

Application Example 8

In the atomic cell manufacturing method according to the application example, it is preferable that, in the preparing of the stacked structure, the communication hole includes a first hole provided in the first substrate, and a second hole that communicates with the first hole and is provided in the second substrate.

With this configuration, it is possible to prevent or suppress an end portion of the communication hole on the side of the inner space from being overlapped with the position of the inner space in a plan view.

Application Example 9

In the atomic cell manufacturing method according to the application example, it is preferable that in the sealing of the inner space, the fusion is performed using a flame.

With this configuration, it is possible to easily perform the sealing process.

Application Example 10

In the atomic cell manufacturing method according to the application example, it is preferable that in the sealing of the inner space, the fusion is performed using a laser.

With this configuration, it is possible to easily perform the sealing process even when miniaturization of the atomic cell is intended.

Application Example 11

In the atomic cell manufacturing method according to the application example, it is preferable that in the preparation of the stacked structure, the stacked structure includes plural sets of the inner space and the communication hole.

With this configuration, it is possible to efficiently manufacture the atomic cell.

Application Example 12

In the atomic cell manufacturing method according to the application example, it is preferable that after the sealing of the inner space, the stacked structure is individualized for each set of the inner space and the communication hole.

With this configuration, it is possible to efficiently manufacture the atomic cell.

Application Example 13

This application example is directed to a quantum interference device including the atomic cell according to the application example, a light output section that outputs excitation light for exciting the metallic atoms, and a light detecting section that detects the excitation light that passes through the atomic cell.

With this configuration, it is possible to suppress the intensity of light after passage in the atomic cell having the sealing portion formed by fusion from being reduced. As a result, it is possible to enhance characteristics of a quantum interference device.

Application Example 14

This application example is directed to an atomic oscillator including the atomic cell according to the application example.

With this configuration, it is possible to suppress the intensity of light after passage in the atomic cell having the sealing portion formed by fusion from being reduced. As a result, it is possible to enhance characteristics of an atomic oscillator.

Application Example 15

This application example is directed to an electronic device including the atomic cell according to the application example.

With this configuration, it is possible to suppress the intensity of light after passage in the atomic cell having the sealing portion formed by fusion from being reduced. As a result, it is possible to enhance characteristics of an electronic device.

Application Example 16

This application example is directed to a moving object including the atomic cell according to the application example.

With this configuration, it is possible to suppress the intensity of light after passage in the atomic cell having the sealing portion formed by fusion from being reduced. As a result, it is possible to enhance characteristics of a moving object.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an atomic cell, an atomic cell manufacturing method, a quantum interference device, anatomic oscillator, an electronic device, and a moving object according to embodiments of the invention will be described based on embodiments shown in the accompanying drawings.

1. Quantum Interference Device (Atomic Oscillator)

First, a quantum interference device according to an embodiment of the invention (quantum interference device including an atomic cell according to an embodiment of the invention) will be described. Hereinafter, an example in which the quantum interference device of the present embodiment is applied to an atomic oscillator is described, but the quantum interference device of the present embodiment is not limited thereto, and for example, may be applied to a magnetic sensor, a quantum memory, or the like, in addition to the atomic oscillator.

First Embodiment

Figure 1:
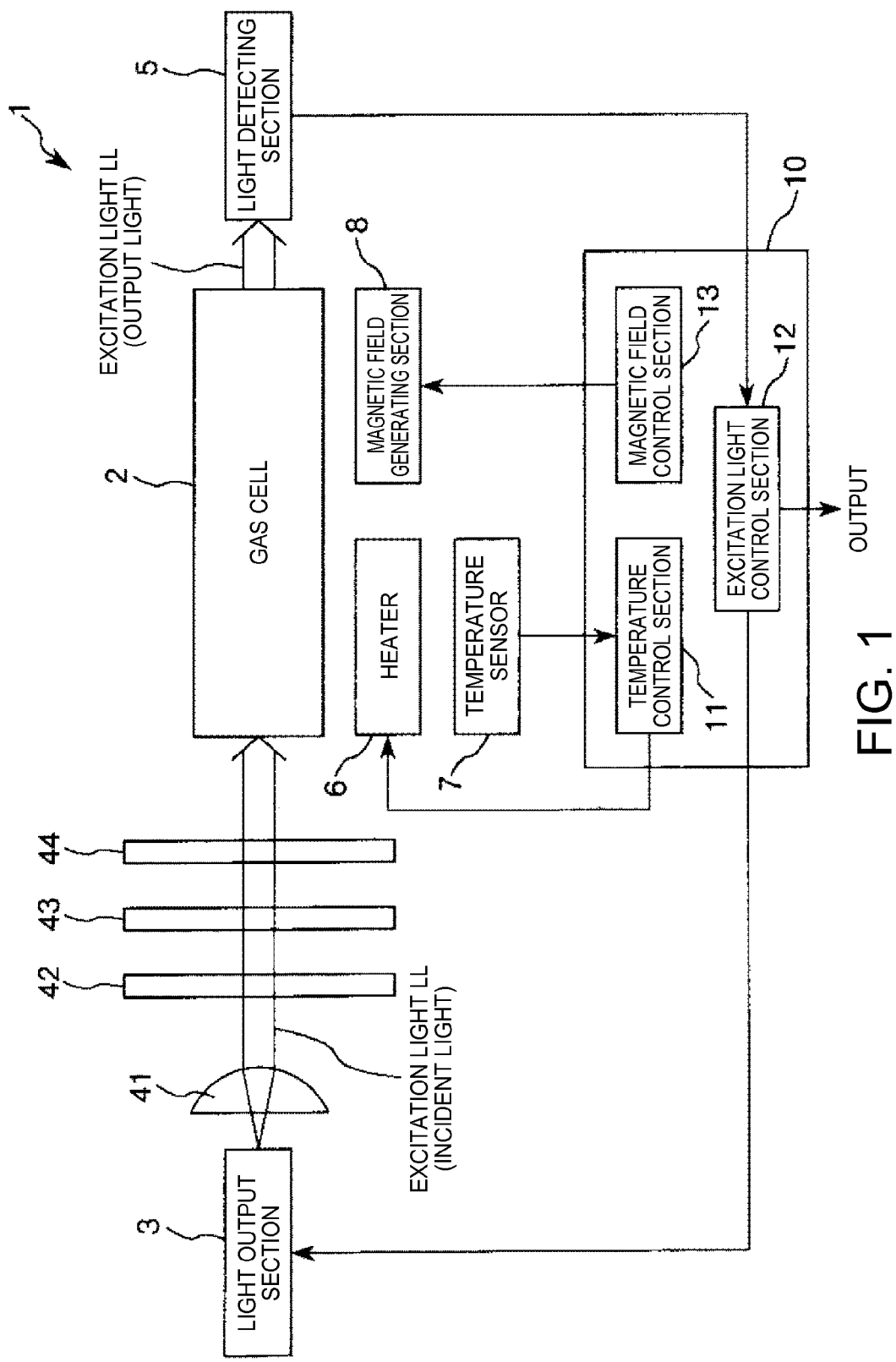
FIG. 1 is a schematic diagram illustrating an atomic oscillator (quantum interference device) according to a first embodiment of the invention.
Figure 2:
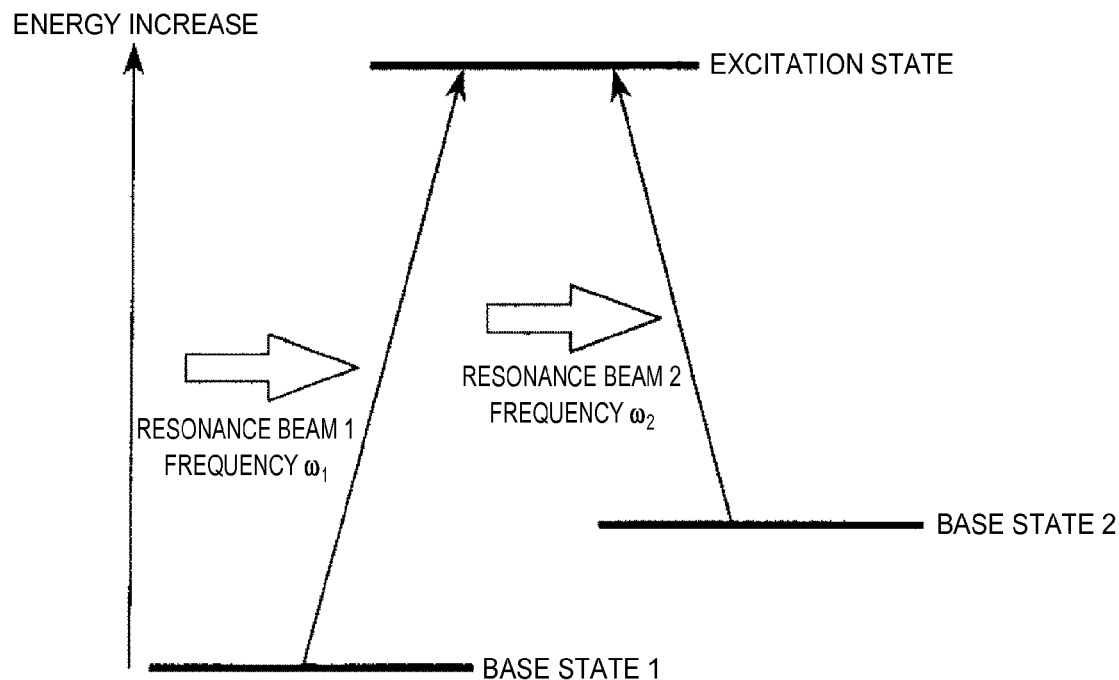
FIG. 2 is a diagram illustrating an energy state of an alkaline metal in an atomic cell of the atomic oscillator shown in FIG. 1.
Figure 3:
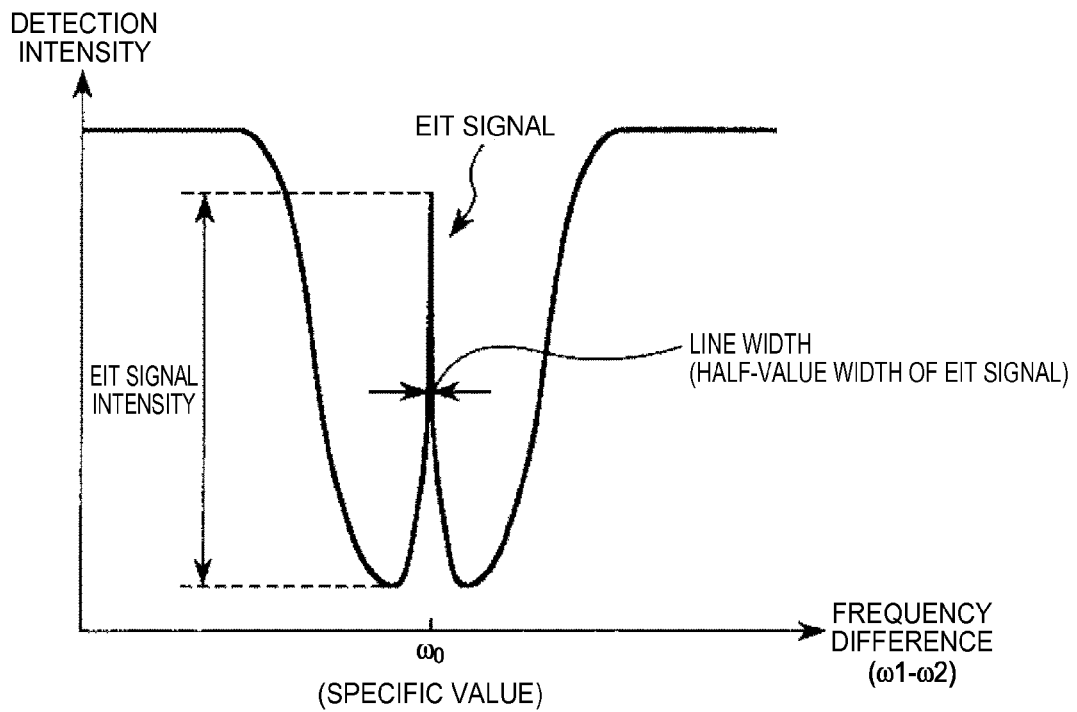
FIG. 3 is a graph illustrating, with respect to a light output section and a light detecting section of the atomic oscillator shown in FIG. 1, a relationship between a frequency difference between two beams from the light output section and a detection intensity in the light detecting section.
Figure 4:
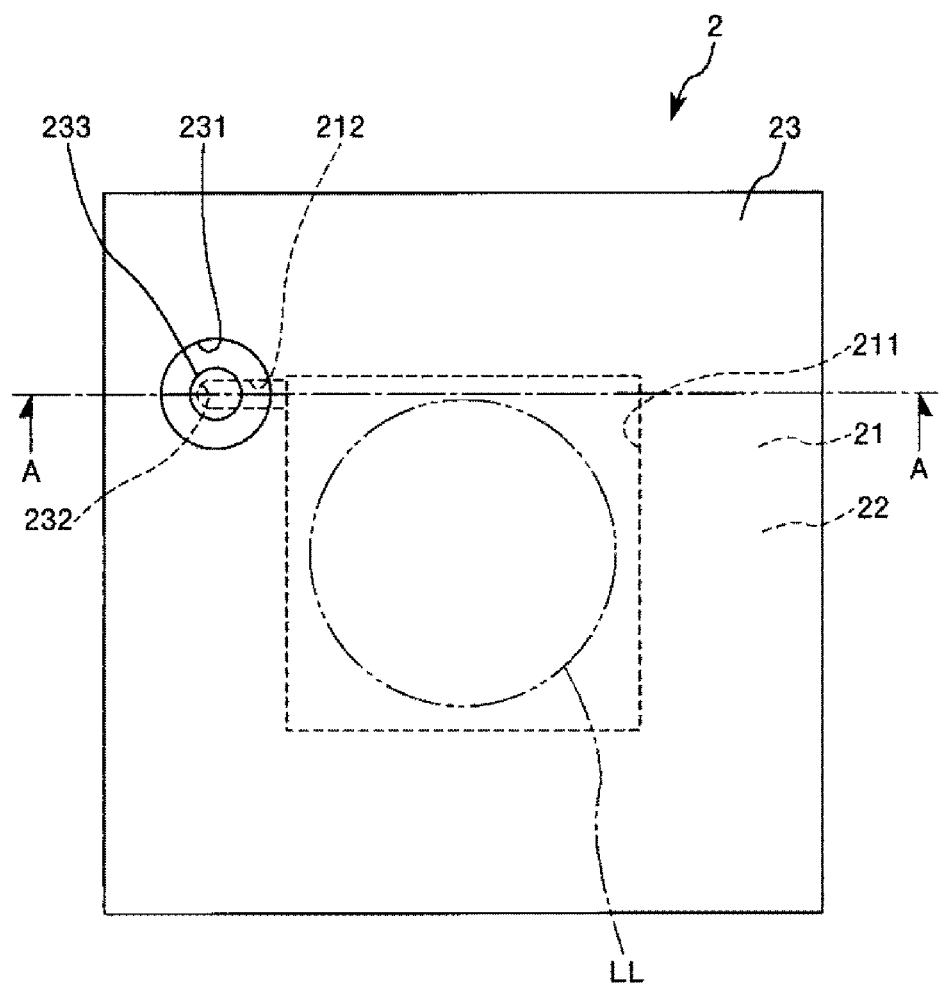
FIG. 4 is a plan view of an atomic cell provided in the atomic oscillator shown in FIG. 1.
Figure 5:
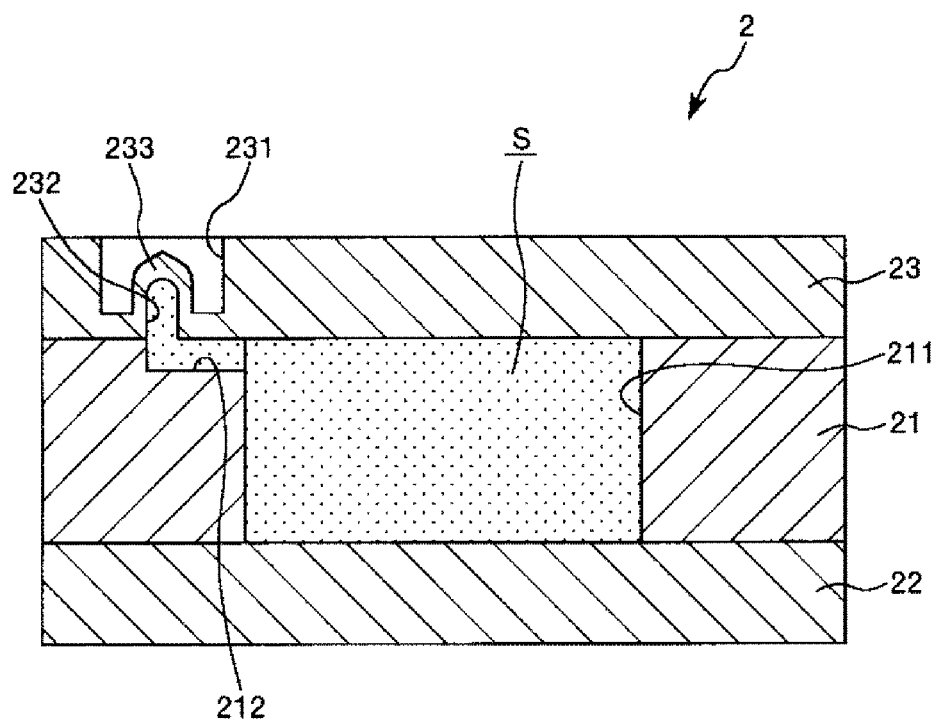
FIG. 5 is a sectional view of the atomic cell shown in FIG. 4 (sectional view taken along line A-A in FIG. 4).

FIG. 1 is a schematic diagram illustrating an atomic oscillator (quantum interference device) according to a first embodiment of the invention. FIG. 2 is a diagram illustrating an energy state of an alkaline metal in an atomic cell of the atomic oscillator shown in FIG. 1, and FIG. 3 is a graph illustrating, with respect to a light output section and a light detecting section of the atomic oscillator shown in FIG. 1, a relationship between a frequency difference between two beams from the light output section and a detection intensity in the light detecting section. Further, FIG. 4 is a plan view of an atomic cell provided in the atomic oscillator shown in FIG. 1, and FIG. 5 is a sectional view (sectional view taken along line A-A in FIG. 4) of the atomic cell shown in FIG. 4.

An atomic oscillator 1 shown in FIG. 1 is an atomic oscillator using coherent population trapping (CPT). The atomic oscillator 1 using the coherent population trapping may achieve a reduction in size compared with an atomic oscillator using a double resonance effect.

As shown in FIG. 1, the atomic oscillator 1 includes an atomic cell 2 (gas cell), a light output section 3, optical components 41, 42, 43, and 44, a light detecting section 5, a heater 6, a temperature sensor 7, a magnetic field generating section 8, and a control section 10.

First, the principle of the atomic oscillator 1 will be briefly described.

In the atomic oscillator 1, an alkaline metal (metallic atoms) such as gaseous rubidium, cesium, or sodium is sealed in the atomic cell 2.

As shown in FIG. 2, the alkaline metal has energy levels of a 3-level system, and may show three states of two base states (base states 1 and 2) and an excitation state having different energy levels. Here, the base state 1 represents an energy state lower than the base state 2.

If the above-mentioned gaseous alkaline metal is irradiated with two resonance beams 1 and 2 having different frequencies, light absorptance (light transmittance) of the resonance beams 1 and 2 in the alkaline metal is changed according to a difference ($\omega1-\omega$) between a frequency $\omega1$ of the resonance beam 1 and a frequency $\omega2$ of the resonance beam 2.

Further, when the difference ($\omega1-\omega2$) between the frequency $\omega1$ of the resonance beam 1 and the frequency $\omega2$ of the resonance beam 2 matches a frequency corresponding to an energy difference between the base state 1 and the base state 2, excitations from the base states 1 and 2 to the excitation state are respectively stopped. Here, both of the resonance beams 1 and 2 pass through the alkaline metal without being absorbed therein. Such a phenomenon is referred to as a CPT phenomenon or an electromagnetically induced transparency (EIT) phenomenon.

The light output section 3 outputs two beams having different frequencies (the resonance beam 1 and the resonance beam 2) toward the atomic cell 2, as described above.

Here, for example, if the frequency $\omega1$ of the resonance beam 1 is fixed and the frequency $\omega2$ of the resonance beam 2 is changed, when the difference ($\omega1-\omega2$) between the frequency $\omega1$ of the resonance beam 1 and the frequency $\omega2$ of the resonance beam 2 matches a frequency $\omega0$ corresponding to an energy difference between the base state 1 and the base state 2, a detection intensity of the light detecting section 5 rapidly increases as shown in FIG. 3.

Such a rapid signal is referred to as an EIT signal. The EIT signal has a specific value determined by the type of the alkaline metal. Accordingly, by using such an EIT signal as a reference, it is possible to realize an oscillator with high accuracy.

Hereinafter, the respective sections of the atomic oscillator 1 will be described in detail.

Atomic Cell

The alkaline metal (metallic atoms) such as the gaseous rubidium, cesium, or sodium is sealed in the atomic cell 2. Further, noble gas such as argon or neon, or an inert gas such as nitrogen may be sealed in the atomic cell 2 as a buffer gas together with the alkaline gas, as necessary.

As shown in FIGS. 4 and 5, the atomic cell 2 includes a body portion 21, and a pair of window portions 22 and 23 with the body portion 21 being interposed therebetween. Here, a structure (a bonded body) that is formed by the body portion 21 and the window portion 22 may form a "first substrate" having a concave portion which is opened on one surface side, and the window portion 23 may form a "second substrate" that is bonded to a surface of the first substrate on a side of the concave portion and forms (configures) an inner space S where the alkaline metal is sealed, together with the first substrate.

In the body portion 21, a through hole 211 that penetrates the body portion 21 in a thickness direction, and a groove 212 that is opened to one surface of the body portion 21 and communicates with the through hole 211 is formed. Here, the body portion 21 may form a third substrate having the through hole 211 that is penetratingly formed in the thickness direction.

In the present embodiment, a transverse section of the through hole 211 forms a square. The shape of the transverse section of the through hole 211 is not limited to the square, and may be a polygon such as a quadrangle or a pentagon, a circle, an ellipse or the like, instead of the square. Further, although not shown, for example, the groove 212 is a V-shaped groove, a U-shaped groove, a rectangular groove, or the like. Further, the groove 212 is opened to the through hole 211 at an end thereof in a length direction.

A material that forms the body portion 21 is not particularly limited, and may be a glass material, quartz crystal, a metal material, a resin material, a silicon material, or the like. Here, it is preferable to use any one of the glass material, the quartz crystal, and the silicon material, and it is more preferable to use the silicon material. Thus, even when an small atomic cell 2 of which a width or height is equal to or smaller than 10 mm is formed, the body portion 21 may be easily formed with high accuracy using a micro processing technique such as etching. Further, when the window portions 22 and 23 are formed of the glass material, the body portion 21 formed of the silicon material may be simply and air-tightly bonded to the window portions 22 and 23 using an anodic bonding method.

The window portion 22 is bonded to one end surface of the body portion 21 having such a configuration, and the window portion 23 is bonded to the other end surface of the body portion 21. Here, the window portion 22 is bonded to one surface of the body portion 21 that forms the third substrate 3, and may form a "fourth substrate" that forms the concave portion included in the first substrate which is the structure including the body portion 21 and the window portion 22, together with the third substrate. The body portion 21 that forms the third substrate and the window portion 22 that forms the fourth substrate may be integrally formed. In this case, by forming a concave portion on one surface side of one substrate by etching or the like, the first substrate having the concave portion that is opened on one surface side may be obtained.

A bonding method of the body portion 21 and the window portions 22 and 23 is determined according to materials of these components, and is not particularly limited as long as the components can be air-tightly bonded. For example, a bonding method using an adhesive, a direct bonding method, an anodic bonding method, or the like may be used.

Here, one end opening of the through hole 211 and an opening of the groove 212 are blocked by the window portion 23, and the other end opening of the through hole 211 is blocked by the window portion 22. Thus, the inner space S where the alkaline metal is sealed is formed. Although not shown, a part of the alkaline metal sealed in the inner space S is present in a gas form, and the remaining part thereof is present as surplus in a liquid form or a solid form. The gaseous alkaline metal accommodated in the inner space S is excited by excitation light LL. Further, the surplus liquid or solid alkaline metal may be disposed in the inner space S, or may be disposed in the groove 212 or a hole 232 (which will be described later).

The window portions 22 and 23 have a plate shape, respectively. Further, the respective window portions 22 and 23 have a light transmitting property with respect to the excitation light from the above-described light projecting section 3. Here, the window portion 22 on one side is an incident side window portion through which the excitation light LL is incident into the inner space S of the atomic cell 2, and the window portion 23 on the other side is an output side window portion through which the excitation light LL is output from the inner space S of the atomic cell 2.

Further, the hole 232 that extends along the thickness direction of the window portion 23 is formed in the window portion 23. An end portion of the hole 232 on the side of the body portion 21 is opened to be connected to the above-mentioned groove 212. Thus, the hole 232 communicates with the inner space S through the groove 212. On the other hand, an end portion of the hole 232 on a side opposite to the body portion 21 is blocked by a sealing portion 233 formed by fusion. Thus, the air-tightness of the inner space S is secured. In the hole 232, the sealing portion 233 may be referred to as a bottomed cylindrical concave portion that is opened on the surface of the window portion 23 on the side of the body portion 21, in which the sealing portion is a bottom portion.

Further, on a surface of the window portion 23 on a side opposite to the body portion 21, a ring-shaped concave portion 231 is formed to surround the above-described hole 232 in a plan view seen in a direction where the body portion 21 and the window portions 22 and 23 are overlapped (hereinafter, simply referred to as a "plan view"). Thus, the thickness of a wall portion where the hole 232 is formed may be made thin. In other words, by providing the concave portion 231, a cylindrical portion in which the hole 232 is a hollow portion may be formed. Since the cylindrical portion is thin in thickness, the sealing portion 233 may be easily formed by fusion.

Here, a space formed by the groove 212 and the hole 232 forms a "communication hole" that communicates with the inner space S. The communication hole is used as an introduction hole for introduction of the alkaline metal into the inner space S in manufacturing of the atomic cell 2, and after the introduction, the sealing portion 233 is formed by fusion. Further, the communication hole may be used as a "metal reserving portion" in which the surplus liquid or solid alkaline metal is disposed. The formation of the sealing portion 233 will be described later in detail together with a method for manufacturing the atomic cell 2. Further, in the present description, the "fusion" refers to a technique of fusing parts of a single member or two members to be integrated or combined. In the present embodiment, the sealing portion 233 is formed by fusing an end opening portion of the cylindrical portion that surrounds the hole 232 to block the hole 232, as described later.

In the present embodiment, a cross-sectional shape of the hole 232 is a circular shape. Further, across-sectional shape of the concave portion 231 is an annular shape according to the cross-sectional shape of the hole 232. The cross-sectional shape of the hole 232 is not limited to the circle, and may be a polygonal shape such as a triangle, a quadrangle or a pentagon, an elliptical shape, or the like, for example. Similarly, the cross-sectional shape of the concave portion 231 is not limited to the above-described shape. For example, the shapes of the inner periphery and the outer periphery may be a polygonal shape such as a triangle, a quadrangle or a pentagon, an elliptical shape, or the like, respectively, or instead, the shape of the inner periphery may be different from the shape of the outer periphery. Further, the concave portion 231 may not surround the entire periphery of the hole 232, but may partially surround the periphery of the hole 232 in a plan view.

In addition, in the figure, the hole 232 has a constant width, but may have a portion of a different width.

Furthermore, the sealing portion 233 is positioned to be closer to the body portion 21 than the surface of the window portion 23 on the side opposite to the body portion 21. That is, the sealing portion 233 is provided to be retreated so as not to outwardly protrude from the surface of the window portion 23 on the side opposite to the body portion 21. Thus, it is possible to achieve miniaturization of the atomic cell 2, and to enhance the degree of freedom for installation of the atomic cell 2.

Further, the width of the hole 232 is not particularly limited. The width is preferably 50 μm to 1000 μm, and more preferably, 70 μm to 500 μm. Thus, in a manufacturing process (which will be described later), it is possible to relatively easily introduce the alkaline metal into the inner space S through the hole 232 while achieving miniaturization of the atomic cell 2.

The material that forms the window portions 22 and 23 is not particularly limited as long as the material has light transmitting properties with respect to the excitation light, as described above, but for example, the material may be a glass material, quartz crystal, or the like, and preferably, the glass material is used. Thus, when the body portion 21 is formed of a silicon material, the body portion 21 and the window portions 22 and 23 may be simply air-tightly bonded by anodic bonding. The window portions 22 and 23 may be formed of silicon according to the thicknesses of the window portions 22 and 23 or the intensity of the excitation light. In this case, the body portion 21 may be formed of a glass material, and the body portion 21 and the window portions 22 and 23 may be bonded by anodic bonding. Alternatively, the body portion 21 may be formed by a silicon material, and the body portion 21 and the window portions 22 and 23 may be directly bonded.

According to the above-described atomic cell 2, the sealing portion 233 is disposed at a position that overlaps a bonding portion of the body portion 21 and the window portion 22 or the window portion 23 in a plan view. Thus, it is possible to prevent or suppress the sealing portion 233 from being overlapped with the position of the inner space S in a plan view. Thus, when light is applied in a direction where the body portion 21 and the window portions 22 and 23 are overlapped, that is, when the window portions 22 and 23 are used as input side and output side window portions with respect to the excitation light, it is possible to prevent or reduce interruption of light passage in the sealing portion 233. Further, when the light is applied in this way, since the light passes through smooth plate surfaces of the window portions 22 and 23, light scattering is reduced, and accordingly, it is possible to suppress the intensity of light after passage from being reduced.

Light Source

The light output section 3 (light source) has a function of outputting the excitation light LL that excites the alkaline metal in the atomic cell 2.

More specifically, the light output section 3 outputs two beams (resonance beam 1 and resonance beam 2) as the excitation light LL having different frequencies as described above.

The resonance beam 1 may excite the alkaline metal in the atomic cell 2 from the above-described base state 1 to the excitation state. On the other hand, the resonance beam 2 may excite the alkaline metal in the atomic cell 2 from the above-described base state 2 to the excitation state.

The light output section 3 is not particularly limited as long as it can output excitation light, but for example, a semiconductor laser such as a vertical cavity surface emitting laser (VCSEL), or the like may be used.

Although not shown, the light output section 3 is adjusted into a predetermined temperature by a temperature adjustment element (heat element, Peltier element, or the like).

Optical Component

The plural optical components 41, 42, 43, and 44 are provided on a light path of the excitation light LL between the above-mentioned light output section 3 and the atomic cell 2, respectively.

Here, the optical component 41, the optical component 42, the optical component 43, and the optical component 44 are sequentially disposed from the side of the light output section 3 to the side of the atomic cell 2.

The optical component 41 is a lens. Thus, the excitation light LL may be applied to the atomic cell 2 without any waste.

Further, the optical component 41 has a function of converting the excitation light LL into parallel light. Thus, it is possible to simply and reliably prevent the excitation light LL from being reflected from an inner wall of the atomic cell 2. Thus, it is possible to preferably generate resonance of the excitation light in the atomic cell 2. As a result, it is possible to improve oscillation characteristics of the atomic oscillator 1.

The optical component 42 is a polarizing plate. Thus, it is possible to adjust polarization of the excitation light LL from the light output section 3 in a predetermined direction.

The optical component 43 is a photosensitive filter (ND filter). Thus, it is possible to adjust (reduce) the intensity of the excitation light LL incident into the atomic cell 2. Accordingly, even when the output of the light output section 3 is high, it is possible to adjust the excitation light incident into the atomic cell 2 into a desired intensity of light. In the present embodiment, the intensity of the excitation light LL having polarization in a predetermined direction, passed through the above-described optical component 42, is adjusted by the optical component 43.

The optical component 44 is a λ/4 wavelength plate. Thus, the optical component 44 may convert the excitation light LL from the light output section 3, from linearly polarized light into circularly polarized light (right-handed circularly polarized light or left-handed circularly polarized light).

As will be described later, in a state where alkaline metallic atoms in the atomic cell 2 are subject to Zeeman splitting by a magnetic field of the magnetic field generating section 8, if excitation light which is linearly polarized light is applied to the alkaline magnetic atoms, by interaction of the excitation light and the alkaline magnetic atoms, the alkaline metallic atoms are equivalently dispersed at plural levels obtained by the Zeeman splitting. As a result, the number of alkaline metallic atoms at a desired energy level is relatively reduced compared with the number of alkaline metallic atoms at other energy levels. Thus, the number of atoms for exhibiting a desired EIT phenomenon is reduced, and the intensity of a desired EIT signal is reduced. As a result, the oscillation characteristics of the atomic oscillator 1 deteriorate.

On the other hand, in a state where alkaline metallic atoms in the atomic cell 2 are subject to Zeeman splitting by a magnetic field of the magnetic field generating section 8, if excitation light which is circularly polarized light is applied to the alkaline metallic atoms, it is possible to relatively increase the number of alkaline metallic atoms at a desired energy level among plural levels obtained by the Zeeman splitting compared with the number of alkaline metallic atoms at other energy levels by interaction of the excitation light and the alkaline magnetic atoms. Thus, the number of atoms for exhibiting a desired EIT phenomenon is increased, and the intensity of a desired EIT signal is increased. As a result, it is possible to enhance the oscillation characteristics of the atomic oscillator 1.

Light Detecting Section

The light detecting section 5 has a function of detecting the intensity of the excitation light LL (resonance beams 1 and 2) having passed through the inside of the atomic cell 2.

The light detecting section 5 is not particularly limited as long as it can detect excitation light, as described above, but for example, a light detector (light receiving element) such as a solar cell or a photodiode may be used.

Heater

The heater 6 (heating section) has a function of heating the above-mentioned atomic cell 2 (more specifically, the alkaline metal in the atomic cell 2). For example, the atomic cell 2 is adjusted to a temperature of 70° C. by the heater 6. Thus, it is possible to maintain the alkaline metal in the atomic cell 2 in a gas form of an appropriate concentration.

The heater 6 is heated by electrification (direct current). Although not shown, the heater 6 is configured by two heating resistors provided on an external surface of the atomic cell 2, for example.

Here, one heat resistor is provided in the window portion 22 (incident side window portion) of the atomic cell 2, and the other heat resistor is provided on the window portion (output side window portion) of the atomic cell 2. By disposing the heat resistor in each of the window portions 22 and 23, it is possible to prevent alkaline metallic atoms from being condensed in the window portions 22 and 23 of the atomic cell 2. As a result, it is possible to enhance the characteristics (oscillation characteristic) of the atomic oscillator 1 over a long period of time.

The heat resistor may be formed of a material having a light transmitting property with respect to the excitation light. Specifically, for example, a transparent electrode material such as an oxide such as indium tin oxide (ITO), indium zinc oxide (IZO), $In_2O_3$, $SnO_2$, Sb-containing $SnO_2$, or Al-containing ZnO may be used.

Further, for example, the heat resistor may be formed using a chemical vapor deposition (CVD) method such as plasma CVD or heat CVD, a dry plating method such as vacuum deposition, a sol-gel method, or the like.

The heater 6 is not limited to the above-described configuration, and various heaters that can heat the atomic cell 2 may be used. Further, the heater 6 may be not in contact with the atomic cell 2. In addition, the atomic cell 2 may be heated using a Peltier element together with the heater 6, or instead of the heater 6.

Temperature Sensor

The temperature sensor 7 detects the temperature of the heater 6 or the atomic cell 2. Further, a heating value of the heater 6 is controlled based on the detection result of the temperature sensor 7. Thus, it is possible to maintain alkaline metallic atoms in the atomic cell 2 at a desired temperature.

An installation position of the temperature sensor 7 is not particularly limited. For example, the temperature sensor 7 may be provided on the heater 6 or on an external surface of the atomic cell 2.

The temperature sensor 7 is not particularly limited, and known various temperature sensors such as a thermistor or a thermocouple may be used.

Magnetic Field Generating Section

The magnetic field generating section 8 has a function of generating a magnetic field for Zeeman-splitting retracted plural energy levels of the alkaline metal in the atomic cell 2. Thus, it is possible to enlarge a gap between different retracted energy levels of the alkaline metal by the Zeeman splitting, to thereby enhance a resolving power. As a result, it is possible to enhance the accuracy of an oscillation frequency of the atomic oscillator 1.

The magnetic field generating section 8 is configured by Helmholtz coils disposed so that the atomic cell 2 is interposed therebetween, or a solenoid coil disposed to cover the atomic cell 2, for example. Thus, it is possible to generate a uniform magnetic field in one direction in the atomic cell 2.

Further, the magnetic field generated by the magnetic field generating section 8 is a constant magnetic field (direct current magnetic field), but an alternating magnetic field may be overlapped therewith.

Control Section

The control section 10 shown in FIG. 1 has a function of controlling the light output section 3, the heater 6, and the magnetic field generating section 8, respectively.

The control section 10 includes an excitation light control section 12 that controls frequencies of the resonance beams 1 and 2 of the light output section 3, a temperature control section 11 that controls the temperature of the alkaline metal in the atomic cell 2, and a magnetic field control section 13 that controls a magnetic field from the magnetic field generating section 8.

The excitation light control section 12 controls frequencies of the resonance beams 1 and 2 output from the light output section 3 based on the detection result of the above-described light output section 5. More specifically, the excitation light control section 12 controls the frequencies of the resonance beams 1 and 2 output from the light output section 3 so that ($\omega 1-\omega$) becomes the above-mentioned frequency $\omega 0$ specific to the above-described alkaline metal. Further, the excitation light control section 12 controls central frequencies of the resonance beams 1 and 2 output from the light output section 3.

Further, the excitation light control section 12 includes a voltage control type quartz oscillator (oscillation circuit) (not shown), and outputs an oscillation frequency of the voltage control type quartz oscillator as an output signal of the atomic oscillator 1 while performing synchronization and adjustment based on the detection result of the light detecting section 5.

Further, the temperature control section 11 controls electrification to the heater 6 based on the detection result of the temperature sensor 7. Thus, it is possible to maintain the atomic cell 2 in a desired temperature range.

In addition, the magnetic field control section 13 controls electrification to the magnetic field generating section 8 so that a magnetic field generated by the magnetic field generating section 8 becomes uniform.

The control section 10 having such a configuration is provided in an IC chip mounted on a board, for example.

According to the atomic oscillator 1 having the above-described configuration, as described above, it is possible to prevent the intensity of light passing through the atomic cell 2 having the sealing portion 233 formed by fusion. As a result, it is possible to enhance the characteristics of the atomic oscillator 1.

The atomic cell 2 included in the atomic oscillator 1 having the above-described configuration may be manufactured by a manufacturing method to be described below.

Atomic Cell Manufacturing Method

Hereinafter, a manufacturing method of the atomic cell 2 will be described as an example of an atomic cell manufacturing method according to an embodiment of the invention.

FIGS. 6A to 6D are diagrams illustrating a method for manufacturing the atomic cell shown in FIG. 4.

The manufacturing method of the atomic cell 2 includes [1] a preparation process of preparing a stacked structure 20 having the inner space S that communicates with the outside through the hole 232, [2] an introduction process of supplying (introducing) alkaline metal into the inner space S through the hole 232, [3] a sealing process of sealing the hole 232 by fusion, and [4] an individualization process of individualizing the stacked body 20 by dicing. Hereinafter, the respective processes will be sequentially described.

[1] Preparation Process

Figure 6A:
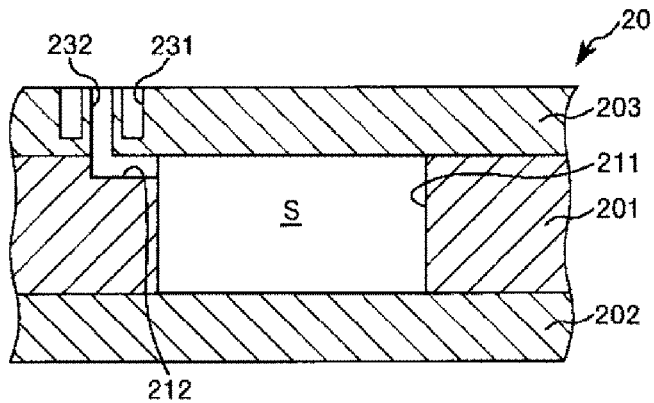
FIGS. 6A to 6D are diagrams illustrating a method for manufacturing the atomic cell shown in FIG. 4.

First, as shown in FIG. 6A, the staked body 20 having the inner space S that communicates with the outside through the hole 232 is prepared.

The stacked structure 20 is formed by sequentially stacking a substrate 202 for formation of the window portion 22, a substrate 201 for formation of the body portion 21, and a substrate 203 for formation of the window portion 23. Here, plural sets of through holes 211 and plural sets of grooves 212 are formed in the substrate 201, and corresponding thereto, plural sets of concave portions 231 and plural sets of holes 232 are formed in the substrate 203.

Here, a structure (bonded body) formed by the substrate 201 and the substrate 202 may form a "first substrate" having a concave portion which is opened on one surface side, and the substrate 203 may form a "second substrate" that is bonded to a surface of the first substrate on a side of the concave portion and forms (configures) an inner space S together with the first substrate. Further, in the present process, the hole 232 may have an opening portion which is disposed at a position that overlaps a bonding portion of the first substrate and the second substrate in a plan view to be opened outside. Further, the substrate 201 forms a "third substrate" having the through hole 211 that penetrates in the thickness direction, and the substrate 202 may form a "fourth substrate" that is bonded to one surface of the third substrate and forms a concave portion together with the third substrate. Further, in the present process, the groove 212 forms a "first hole" provided in the first substrate, and the hole 232 forms a "second hole" that communicates with the first hole and is provided in the second substrate. A space formed by each set of the groove 212 and the hole 232 forms a "communication hole" that connects the corresponding inner space S with an external space.

Further, the substrate 201 is formed of the same material as that of the body portion 21, and the substrates 202 and 203 are formed by the same materials as those of the window portions 22 and 23. Further, the substrate 201 and the substrates 202 and 203 are bonded by the same bonding method as in the bonding of the body portion 21 and the window portions 22 and 23.

Here, in the preparation process [1], the substrates 202 and 203 respectively include glass, and the substrate 201 includes silicon, and thus, it is possible to simply air-tightly bond each of the substrates 202 and 203 and the substrate 201 by anodic bonding.

Further, the formation of the through hole 211 and the groove 212 in the substrate 201 may be simply performed using an etching technique and a photolithography technique with high accuracy, for example. Similarly, the formation of the concave portion 231 and the hole 232 of the substrate 203 may be simply performed using an etching technique and a photolithography technique with high accuracy, for example.

[2] Introduction Process

Figure 6B:
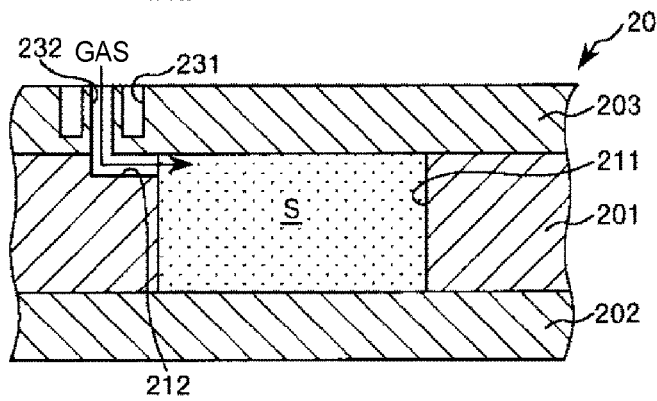

Next, as shown in FIG. 6B, the alkaline metal is introduced into the inner space S through the hole 232.

Specifically, for example, the stacked structure 20 is disposed in a chamber (not shown), the inside of the chamber is once decompressed and is then replaced with a gaseous alkaline metal, and thus, the gaseous alkaline metal (alkaline metal gas) is supplied into the inner space S through the hole 232.

Further, at the same time with the supply of the alkaline metal gas or after the supply of the alkaline metal gas, a buffer gas is supplied into the inner space S through the hole 232. In addition, before the supply of the alkaline metal gas, a coating agent (paraffin, polyorganosiloxane, or the like) may be supplied.

According to the size of the hole 232, or the like, a liquid alkaline metal may be inserted into the inner space S through the hole 232 using a needle or the like.

[3] Sealing Process

Figure 6C:
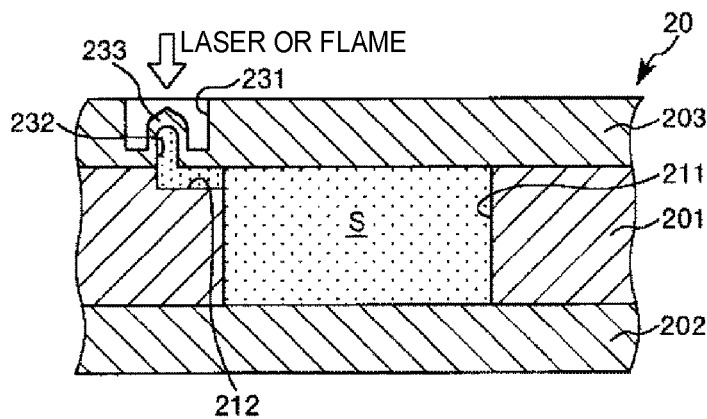

Next, in a state where the alkaline metal gas is introduced into the inner space S, as shown in FIG. 6C, an opening end portion of the hole 232 is blocked by fusion, to thereby form the sealing portion 233. Thus, the inner space S is sealed in a state where the alkaline metal gas is introduced.

The formation of the sealing portion 233 is performed by fusing an opening portion of a wall portion (cylindrical portion) that forms the hole 232 using laser, flame (using a gas burner, for example), or the like to block the hole 232. Thus, it is possible to easily perform the sealing process. Particularly, if such fusion is performed by laser, even when miniaturization of the atomic cell 2 is intended, it is possible to easily perform the sealing process.

Further, after the sealing portion 233 is formed, an external surface of the stacked structure 20 is washed, as necessary, to remove dirt such as the alkaline metal or the like attached to the external surface of the stacked structure 20.

[4] Individualization Process

Figure 6D:
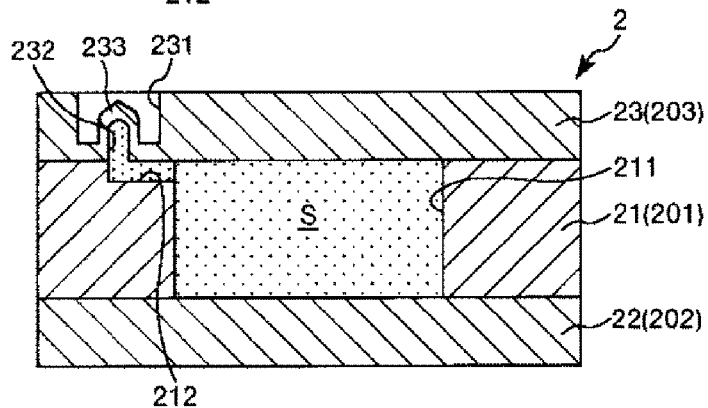

Next, for example, the stacked structure 20 is individualized by dicing. Thus, as shown in FIG. 6D, the atomic cell 2 is obtained.

In this way, in the preparation process [1], the stacked structure 20 having plural sets of inner space S and communication holes (grooves 212 and holes 232) is prepared, and in the individualization process [4] after the sealing process [3], the stacked structure 20 is individualized for each set of the inner space S and the communication hole, and thus, it is possible to efficiently manufacture the atomic cell 2.

According to the manufacturing method of the atomic cell 2 as described above, it is possible to obtain the atomic cell 2 having the above-described effects.

Here, as the substrates 202 and 203 are used as the window portions 22 and 23, it is possible to effectively reduce scattering of light in the respective window portions 22 and 23 due to smoothness of the surfaces of the substrates 202 and 203.

Further, since the stacked structure 20 has a protruding cylindrical portion that surrounds the opening portion of the hole 232 in the preparation process [1], it is possible to easily block the opening portion of the hole 232 by fusion in the sealing process [3]. On the other hand, for example, if the concave portion 231 is not provided, heat generated when the opening portion of the hole 232 is fused may be diffused over a wide range according to the width of the hole 232 or the like, which may damage the flatness of the window portions 22 and 23.

Further, in the preparation process [1], the external space and the inner space S communicate with each other through the communication hole configured by the hole 212 provided in the substrate 201 and the hole 232 that communicates with the groove 212 and is provided in the substrate 203. Thus, it is possible to prevent or suppress an end portion of the communication hole on the side of the inner space S from being overlapped with the position of the inner space S in a plan view.

Second Embodiment

Next, a second embodiment of the invention will be described.

Figure 7:
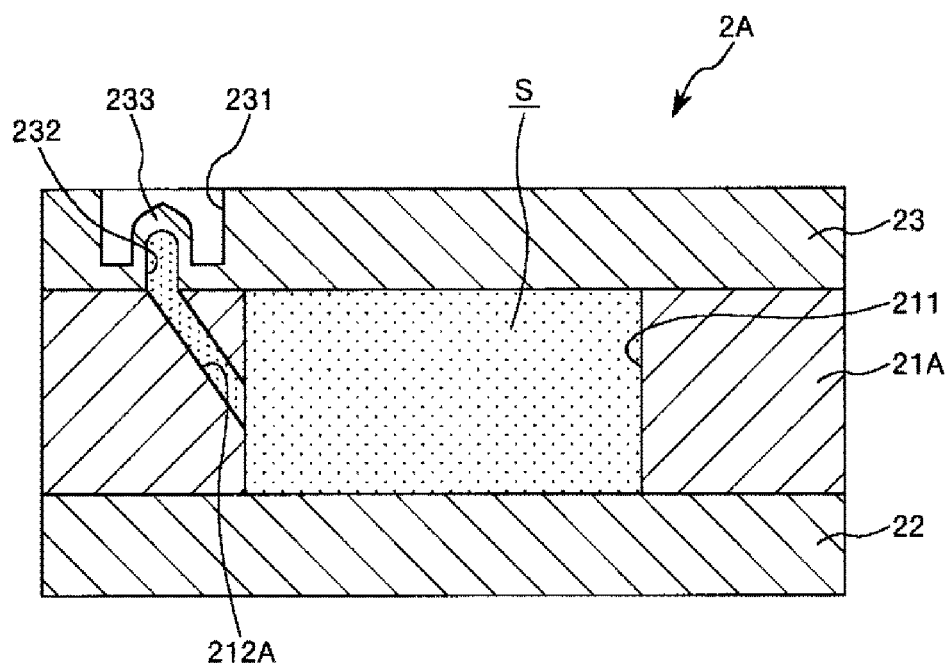
FIG. 7 is a sectional view illustrating an atomic cell according to a second embodiment of the invention.

FIG. 7 is a sectional view illustrating an atomic cell according to the second embodiment of the invention.

The present embodiment is the same as the above-described first embodiment except that a configuration of the atomic cell is different.

In the following description, different points of the second embodiment compared with the above-described embodiment will be mainly described, and description about the same points will not be repeated. Further, in FIG. 7, the same reference numerals are given to the same components as in the above-described embodiment.

An atomic cell 2A of the present embodiment is the same as the atomic cell 2 of the above-described first embodiment except that a configuration of a hole through which the hole 232 communicates with the inner space S is different.

The atomic cell 2A includes a body portion 21A instead of the body portion 21 in the first embodiment. The body portion 21A includes a hole 212A through which the inner space S communicates with the hole 232. The hole 212A is opened to a side surface of the through hole 211 at one end thereof (an end on the side of the inner space S), and is opened to a surface of the body portion 21A on the side of the window portion 23 at the other end thereof (an end on the side of the window portion 23). Particularly, the end of the hole 212A on the side of the inner space S is disposed in the middle of the body portion 21A in the thickness direction. Thus, it is possible to increase distances between the opening of the hole 212A and the respective window portions 22 and 23. Accordingly, even when a liquid alkaline metal is disposed in the hole 212A or the hole 232, it is possible to suppress the alkaline metal from being solidified in the respective window portions 22 and 23.

Third Embodiment

Next, a third embodiment of the invention will be described.

Figure 8:
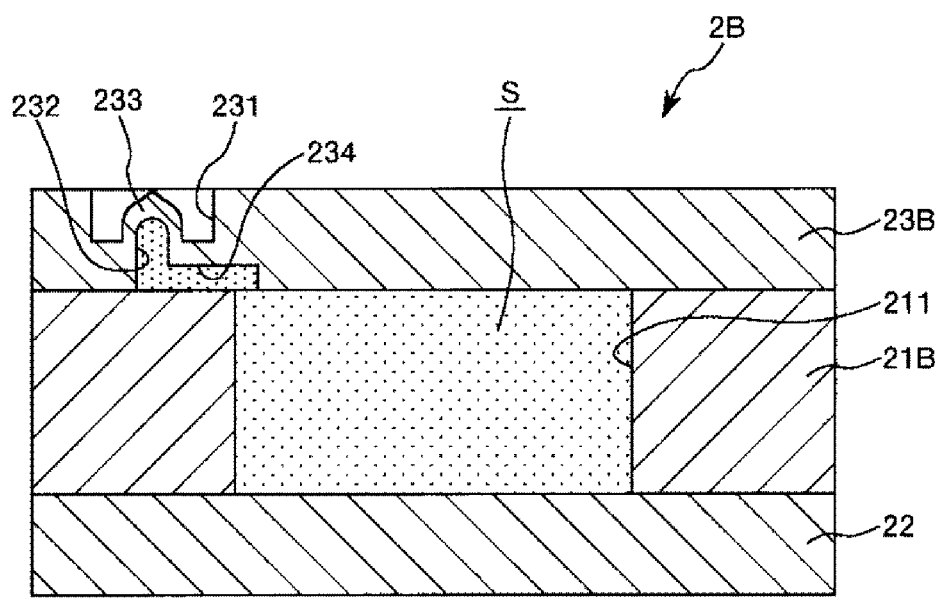
FIG. 8 is a sectional view illustrating an atomic cell according to a third embodiment of the invention.

FIG. 8 is a sectional view illustrating an atomic cell according to the third embodiment of the invention.

The present embodiment is the same as the above-described first embodiment except that a configuration of the atomic cell is different.

In the following description, different points of the third embodiment compared with the above-described embodiment will be mainly described, and description about the same points will not be repeated. Further, in FIG. 8, the same reference numerals are given to the same components as in the above-described embodiments.

An atomic cell 2B of the present embodiment is the same as the atomic cell 2 of the above-described first embodiment except that a configuration of a hole through which the hole 232 communicates with the inner space S is different.

The atomic cell 2B includes a body portion 21B and a window portion 23B instead of the body portion 21 and the window portion 23 in the first embodiment. The body portion 21B is the same as the body portion 21 in the first embodiment except that the groove 212 in the first embodiment is not provided. A groove 234 through which the hole 232 communicates with the inner space S is provided on a surface of the window portion 23B on the side of the body portion 21B.

According to the atomic cell 2B, it is possible to simplify the configuration of the body portion 21B. Further, since the groove 234 can be integrally formed with the groove 232, it is possible to prevent a manufacturing method of the window portion 23B from being complicated.

2. Electronic Device

The above-described atomic oscillator may be applied to various electronic devices. According to such an electronic device, it is possible to enhance its characteristic.

Hereinafter, an electronic device according to an embodiment of the invention will be described.

Figure 9:
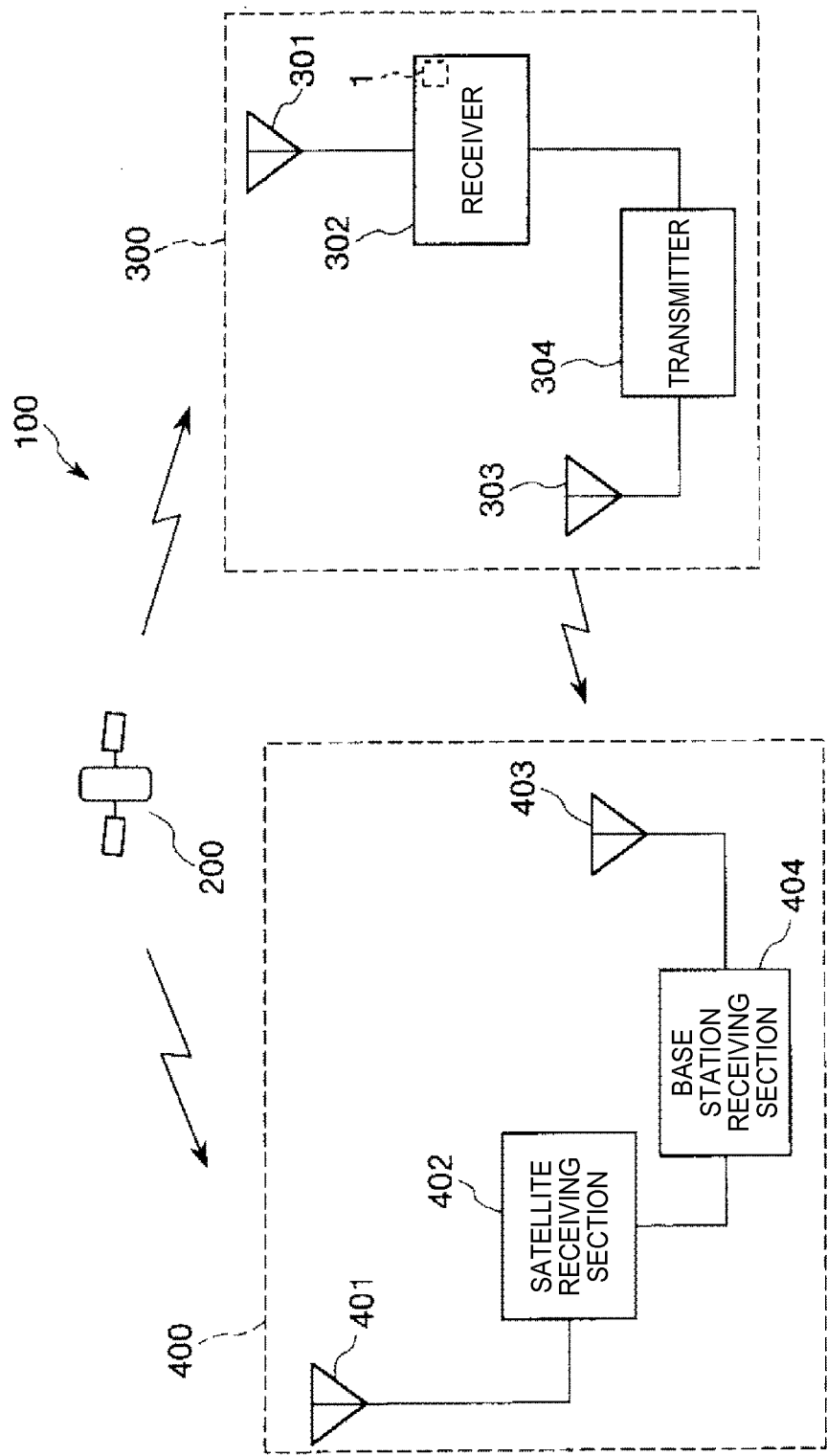
FIG. 9 is a diagram illustrating a schematic configuration when an atomic oscillator according to an embodiment of the invention is used in a positioning system using a GPS satellite.

FIG. 9 is a diagram illustrating a schematic configuration in which the atomic oscillator according to the invention is used in a positioning system using a GPS satellite.

A positioning system 100 shown in FIG. 9 includes a GPS satellite 200, a base station 300, and a GPS receiver 400.

The GPS satellite 200 transmits positioning information (GPS signal).

The base station 300 includes a receiver 302 that receives positioning information from the GPS satellite 200 through an antenna 301, for example, provided at an electronic reference point (GPS continuous observation station) with high accuracy, and a transmitter 304 that transmits the positioning information received by the receiver 302 through an antenna 303.

Here, the receiver 302 is an electronic device that includes the atomic oscillator 1 according to the invention as a reference frequency oscillation source. The receiver 302 having such a configuration has excellent reliability. Further, the positioning information received by the receiver 302 is transmitted by the transmitter 304 in real time.

The GPS receiver 400 includes a satellite receiving section 402 that receives positioning information from the GPS satellite 200 through an antenna 401, and a base station receiving section 404 that receives positioning information from the base station 300 through an antenna 403.

3. Moving Object

Figure 10:
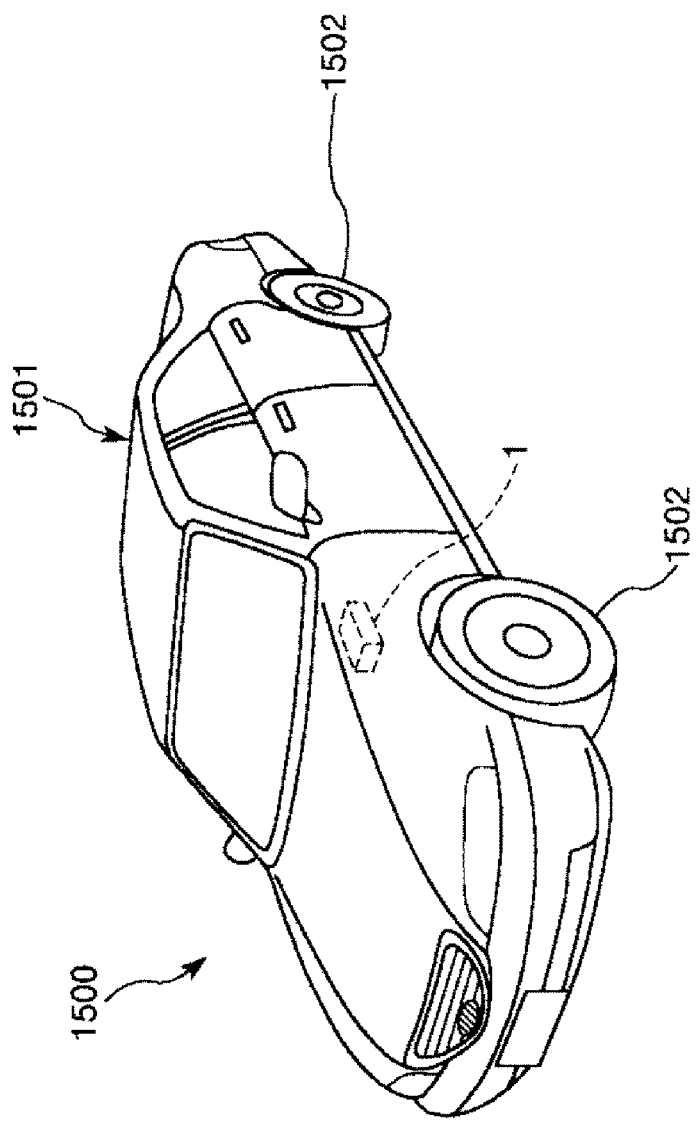
FIG. 10 is a diagram illustrating a moving object according to an embodiment of the invention.

FIG. 10 is a diagram illustrating an example of a moving object according to an embodiment of the invention.

In the figure, a moving object 1500 includes a vehicle body 1501, and four wheels 1502, in which the wheels 1502 are rotated by an engine (not shown) provided in the vehicle body 1501. The atomic oscillator 1 is built in the moving object 1500.

According to such a moving object, it is possible to enhance its characteristic.

The electronic device including the atomic oscillator according to the invention is not limited to the above description. For example, the electronic device may be applied to a mobile phone, a digital still camera, an inkjet type injection device (for example, an inkjet printer), a personal computer (a mobile type personal computer or a laptop type personal computer), a television, a video camera, a video tape recorder, a car navigator, a pager, an electronic organizer (including a communication function), an electronic dictionary, an electronic calculator, an electronic game player, a word processor, a work station, a TV phone, a TV monitor for crime prevention, electronic binoculars, a POS terminal, a medical device (for example, an electronic thermometer, a blood pressure manometer, a blood glucose monitoring system, an electrocardiographic apparatus, an ultrasonic diagnostic equipment, or an electronic endoscopy), a fish-finder, various measuring apparatuses, meters (for example, meters of a vehicle, an airplane or a ship), a flight simulator, a terrestrial digital broadcasting, a mobile phone base station, or the like.

Hereinbefore, the atomic cell, the atomic cell manufacturing method, the quantum interference device, the atomic oscillator, the electronic device, and the moving object according to the invention have been described with reference to the accompanying drawings, but the invention is not limited thereto.

Further, the invention may have a configuration in which one process or two or more processes having an arbitrary purpose are additionally provided. In addition, the invention may have a configuration in which an arbitrary component having the same function as in the above-described embodiment is substitutively provided, and a configuration in which an arbitrary component is added thereto.

Further, the invention may have a configuration in which arbitrary components of the above-described embodiments are combined.

Furthermore, in the above-described embodiments, an example in which the window portion (second substrate) is processed to form the opening portion and the sealing portion of the communication hole is described, but the invention is not limited thereto. For example, a glass tube may be bonded to a body portion (first substrate), so that an opening portion and a neighboring portion of a communication hole may be formed.

What is claimed is:

1. An atomic cell comprising:
   metallic atoms;
   a first substrate having a concave which is opened on one surface side thereof, the concave having a bottom surface and an inner side wall;
   a second substrate that is bonded to the one surface side of the first substrate, and forms an inner space where the metallic atoms are sealed, together with the first substrate;
   a communication hole that communicates with the inner space, the communication hole extending from the inner side wall directly adjacent to a lower surface of the second substrate, the communication hole further extending into the second substrate so that the communication hole is in a bent-shaped structure; and
   a sealing portion that is disposed at one end of the communication hole in the second substrate directly adjacent to an upper surface of the second substrate.

2. The atomic cell according to claim 1,
   wherein the sealing portion is located between the upper surface and the lower surface of the second substrate.

3. A quantum interference device comprising:
   the atomic cell according to claim 2;
   a light output section that outputs excitation light for exciting the metallic atoms; and
   a light detecting section that detects the excitation light that passes through the atomic cell.

4. An atomic oscillator comprising the atomic cell according to claim 2.

5. An electronic device comprising the atomic cell according to claim 2.

6. A moving object comprising the atomic cell according to claim 2.

7. A quantum interference device comprising:
   the atomic cell according to claim 1;
   a light output section that outputs excitation light for exciting the metallic atoms; and
   a light detecting section that detects the excitation light that passes through the atomic cell.

8. An atomic oscillator comprising the atomic cell according to claim 1.

9. An electronic device comprising the atomic cell according to claim 1.

10. A moving object comprising the atomic cell according to claim 1.

11. The atomic cell according to claim 1,
    wherein the concave is in a cubic shape, and the inner side wall is configured with first through fourth inner side walls, and
    the communication hole extends from the first inner side wall directly adjacent to the lower surface of the second substrate.

12. An atomic cell manufacturing method comprising:
    preparing a stacked structure that includes a first substrate having a concave portion which is opened on one surface side thereof, a second substrate that is bonded to the one surface side of the first substrate and forms an inner space together with the first substrate, and a communication hole that has an opening portion which is disposed at a position that overlaps a bonding portion of the first substrate and the second substrate in a plan view seen in a direction where the first substrate and the second substrate are overlapped and is opened outside and through which the inner space communicates with an external space, and
    sealing the inner space by blocking the opening portion of the communication hole by fusion in a state where metallic atoms are introduced in the inner space.

13. The atomic cell manufacturing method according to claim 12,
    wherein in the preparing of the stacked structure, the first substrate includes a third substrate having a through hole that is penetratingly formed in a thickness direction, and a fourth substrate that is bonded to one surface of the third substrate and forms the concave portion together with the third substrate.

14. The atomic cell manufacturing method according to claim 13, wherein in the preparing of the stacked structure, the second substrate and the fourth substrate include glass, respectively, and the third substrate includes silicon.

15. The atomic cell manufacturing method according to claim 12,
wherein in the preparing of the stacked structure, the opening portion of the communication hole is provided in the second substrate.

16. The atomic cell manufacturing method according to claim 12,
wherein in the preparing of the stacked structure, the stacked structure has a protruding cylindrical portion that surrounds the opening portion of the communication hole.

17. The atomic cell manufacturing method according to claim 12,
wherein in the preparing of the stacked structure, the communication hole includes a first hole provided in the first substrate, and a second hole that communicates with the first hole and is provided in the second substrate.

18. The atomic cell manufacturing method according to claim 12,
wherein in the sealing of the inner space, the fusion is performed using flame.

19. The atomic cell manufacturing method according to claim 12,
wherein in the sealing of the inner space, the fusion is performed using laser.

20. The atomic cell manufacturing method according to claim 12,
wherein in the preparing of the stacked structure, the stacked structure includes plural sets of the inner space and the communication hole.

21. The atomic cell manufacturing method according to claim 20,
wherein after the sealing of the inner space, the stacked structure is individualized for each set of the inner space and the communication hole.

22. An atomic cell comprising:
metallic atoms;
a first substrate having a concave which is opened on one surface side thereof;
a second substrate that is bonded to the one surface side of the first substrate, and forms an inner space where the metallic atoms are sealed, together with the first substrate;
a communication hole that communicates with the inner space, the communication hole extending from a lower surface of the second substrate toward an upper surface of the second substrate, the communication hole being in a bent-shaped structure; and
a sealing portion that is disposed at one end of the communication hole in the second substrate directly adjacent to an upper surface of the second substrate, the sealing portion is laterally shifted from the concave in a plan view.

* * * * *